United States Patent [19]

Wanlass

[11] 4,203,159
[45] May 13, 1980

[54] PSEUDOSTATIC ELECTRONIC MEMORY

[76] Inventor: Frank M. Wanlass, 21498 Meteor Dr., Cupertino, Calif. 95014

[21] Appl. No.: 948,683

[22] Filed: Oct. 5, 1978

[51] Int. Cl.² .................... G11C 7/00; G11C 11/24
[52] U.S. Cl. .................................... 365/222; 365/149
[58] Field of Search .................. 365/222, 149, 150

[56] References Cited

U.S. PATENT DOCUMENTS

| 3,922,650 | 11/1975 | Schaffer | 365/222 |
| 4,112,510 | 9/1978 | Baker | 365/222 |
| 4,122,550 | 10/1978 | Caywood | 365/222 |

Primary Examiner—Stuart N. Hecker

Attorney, Agent, or Firm—C. Michael Zimmerman

[57] ABSTRACT

An electronic memory is described which has only two transistors in each memory cell, but does not require that data processing be periodically interrupted to enable refreshing. It adds to a typical, single transistor cell dynamic memory one additional transistor per cell, and a duplication of the driving and sensing circuitry typically included in such a memory. The additional transistor in each cell provides access to the same for refreshing, which refreshing is accomplished by the additional driving and sensing circuitry at the very same time the memory is otherwise being accessed for data processing.

5 Claims, 4 Drawing Figures

PSEUDOSTATIC ELECTRONIC MEMORY

BACKGROUND OF THE INVENTION

The present invention relates to electronic memories and, more particularly, to a dynamic electronic memory requiring only one additional gating transistor per capacitive memory cell to eliminate the need of refreshing the cells through the normal cell accessing lines.

High speed electronic memories are now widely used as the main memory of digital computers and the like. Such memories not only provide high access times, but because of the advances in integrated circuitry, can be designed to require a minimum of space. In this connection, it is now common for a single integrated circuit chip to store more than 4,000 bits of information. Single chips capable of reliably storing 16,000 bits of information are eminent.

Because of its simplicity and the minimum amount of space required for it in integrated circuitry, the single transistor cell memory has become the work horse of the industry. The article entitled "Sense Amplifier Design is Key to One-Transistor Cell in 4,096-bit RAM" by Clinton Kuo et al, appearing on pages 116 et seq. of the Sept. 13, 1973 issued of *ELECTRONICS*, describes such a memory.

The single transistor cell memory is a dynamic memory, i.e., the electrical charge on each cell indicative of information is capacitatively stored, with the result that such charge needs to be periodically renewed ("refreshed") in view of transistor and capacitor leakage. The refreshing operation is typically conducted by periodically interrupting use of the memory for data processing, and then cycling through the cells to refresh the same. The need to refresh therefore limits the overall speed of dynamic electronic memories, as well as requires additional control circuitry. Because of this, dynamic electronic memories often are not an optimum choice for the main memory of smaller systems, such as microcomputer systems. Such systems typically do not require a sufficient amount of memory to warrant the overhead of the control circuitry and speed limitations associated with dynamic memories. For this reason, so-called "static" memories which do not require a refreshing operation are often used for smaller systems. Each cell of such a static memory often will have as many as six transistors. While the cost per bit of such a memory is quite high, a smaller system typically requires less total main memory so that elimination of the cost and trouble of refreshing is warranted.

SUMMARY OF THE INVENTION

The present invention provides a dynamic cell memory which appears to be "static", and extends the practical use of dynamic cell memories to those smaller systems which in the past have had to rely on static electronic memories. It accomplishes this with the addition of only one active element, a transistor, to each cell, and a simple duplication of the driving and sensing circuitry typically included with a dynamic memory. In its basic aspects, the pseudostatic electronic memory of the invention includes not only the single transistor associated with each cell for controlling the application and sensing of charges on the cell, but a separate, independent means to detect and refresh periodically such charges on each of such cells. This means preferably takes the form of an additional electronic switch (e.g. a field effect transistor) in each cell connected to the cell capacitance, which switch is controlled by a refresh sense amplifier and driver to periodically refresh the charge.

BRIEF DESCRIPTION OF THE DRAWING

With reference to the accompanying two sheets of drawing.

DETAILED DESCRIPTION OF A PREFERRED EMBODIMENT

Figure 1:
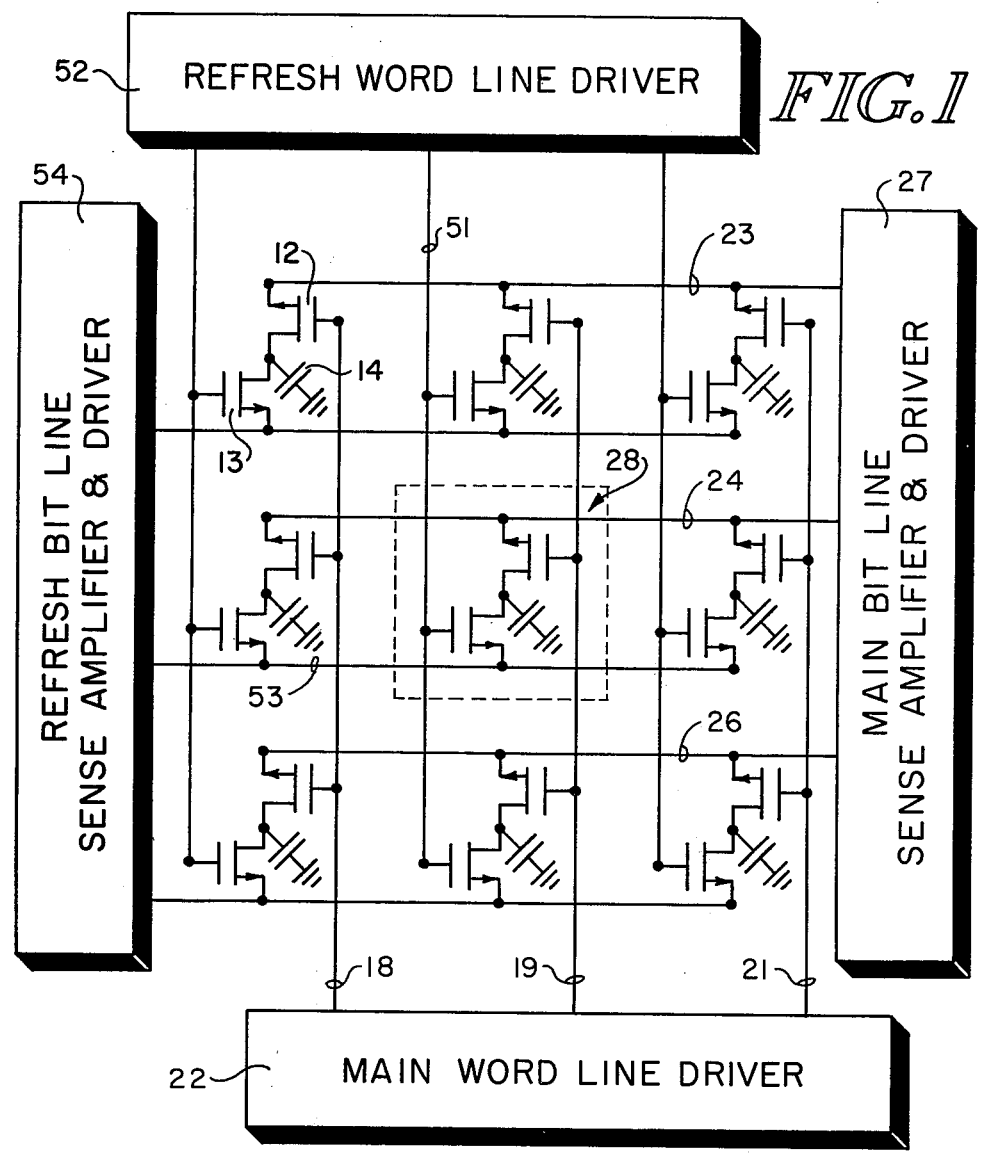
FIG. 1 is an overall schematic representation of a preferred embodiment of the pseudostatic electronic memory of the invention.

There is shown in FIG. 1, a nine-cell electronic memory made up of a 3×3 array. Each cell of the array includes two field effect transistors 12 and 13, and a capacitor 14. Capacitor 14 is connected between ground represented at 16, and a common connection 17 between the sources of the transistors 12 and 13. While for simplicity the invention is described in connection with a nine-cell electronic memory, in actual practice such a memory most often will be made up of a plurality of integrated circuitry chips, each one of which will include many more cells, e.g., 4,096. Generally, one cell is provided for each bit of information to be stored. This information typically will be coded in binary digit form with each cell storing one of two significantly different voltage levels, one representing a binary "0" and the other representing a binary "1".

Each of the transistors 12 and 13 is a field effect transistor formed by MOS technology typical of integrated circuitry. As will become more apparent below, these transistors act, in effect, as electronic switches for controlling the application, detection and refreshing of a charge on the capacitor 14, which capacitor provides the capacitative memory of the cell. Transistors 12 and 13 are illustrated as N-channel type. It will be appreciated, though, that the invention is equally applicable to memories having P-channel transistors.

Figure 2:
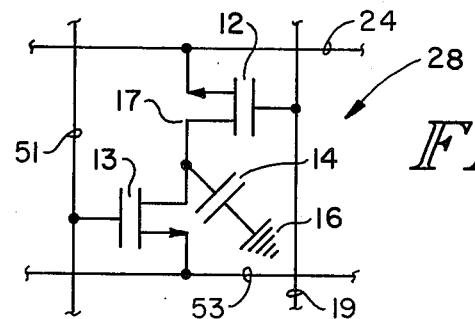
FIG. 2 is an enlarged schematic view of a single cell of the pseudostatic electronic memory of FIG. 1.

Transistor 12 of each cell controls accessing of such cell for data processing. That is, it is transistor 12 which is the switch used during data processing to read the information stored at the cell (sense the amount of charge stored thereat) and change such information if desired. To this end, the gate of such transistor of each of the cells is connected to one of a plurality of main word lines 18, 19, and 21 emanating from conventional word line drive circuitry represented in FIG. 1 by block 22. Upon application to a particular word line of an appropriately selected voltage, the capacitor 14 of each of the cells associated with such particular word line will be capable of reacting to the main bit line also associated therewith, to indicate the state of its charge and receive an appropriate charge level. In this connection, main bit lines 23, 24, and 26 are illustrated emanating from main bit line sense amplifier and driver circuitry represented in FIG. 1 by block 27. Each of these bit lines is connected to the emitters of the transistor 12 of a plurality of cells individually controlled by different main word lines. For example, if word line 19 is activated and it is main bit line 24 which is at an appropriate voltage state for reading or writing information, it will be the central cell, outlined in FIG. 1 by dotted line block 28, which will be addressed. FIG. 2 provides an enlargement of such cell, and FIG. 3 illustrates schematically various voltage levels associated therewith and with a conventional cell.

Figure 3:
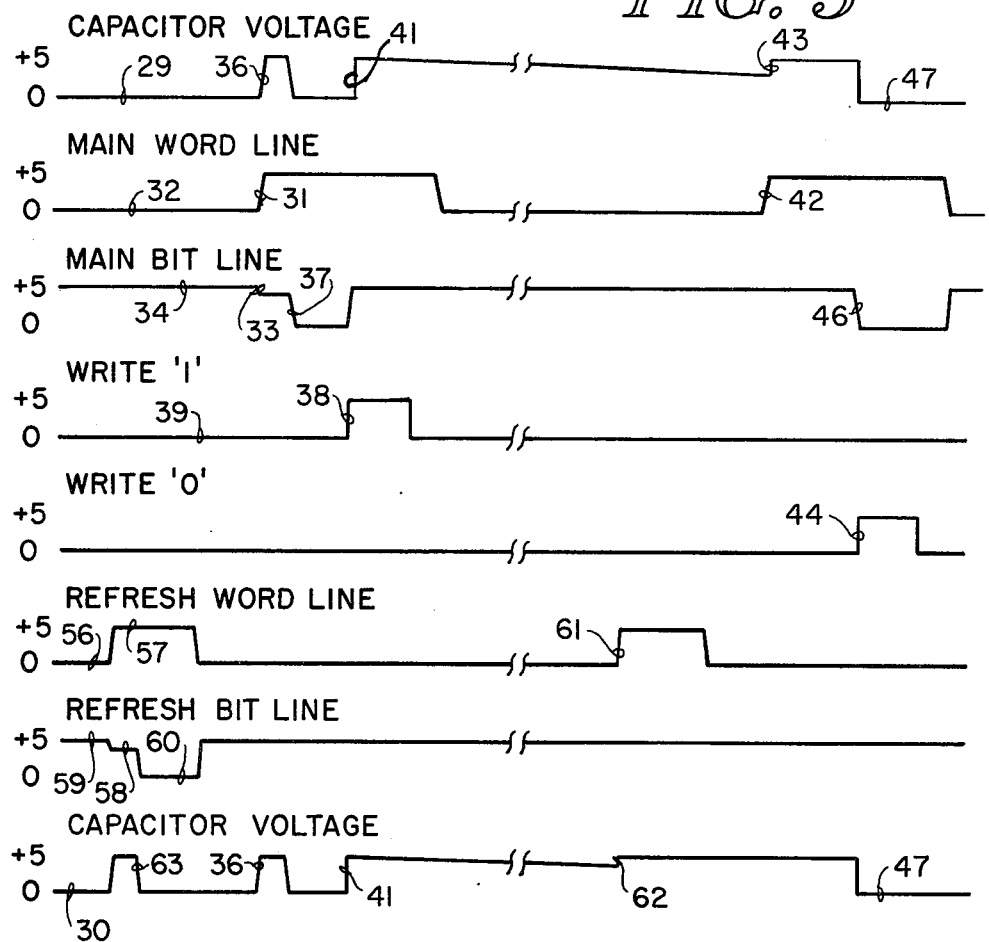
FIG. 3 is a pulse and voltage level diagram illustrating operation of the preferred embodiment of FIG. 1.

With reference to FIG. 3, voltage level line 29 represents the charge on a capacitor of a conventional cell which does not include the information refreshing aspect of the instant invention, and voltage level line 30 represents the charge on the capacitor of cell 28 incorporating the invention. Electronic memory incorporating the invention operates conventionally insofar as data processing is concerned. Thus, operation of the memory for data processing will be described in the following, generally ignoring the fact that the cell 28 is not conventional. The differences between its operation and that of a conventional cell will then be explained.

It will be assumed in the following that when the charge level on capacitor 14 is zero with respect to ground, it represents the binary digit "0". When the charge level is significantly higher, e.g. 3.5–4.0 volts positive relative to ground, it represents the binary digit "1". Thus, as can be seen from referring to line 29 of FIG. 3, the charge on capacitor 14 of cell 28 is initially zero with respect to ground so that the "information" stored by such cell represents a binary "0". Whenever a memory cell of either the invention or of a conventional single cell electronic memory is addressed, it is common to first read the charge or, in other words, information, stored on its capacitance and then write whatever information (apply charge) it then is desired be stored at the cell.

Cell 28 is addressed for reading and/or writing information by placing on main word line 19 an appropriate voltage level which will result in transistor 12 of such cell being gated ON. This change in voltage level is represented in FIG. 3 by the five-volt pulse 31 shown on voltage level line 32. It will be appreciated that this change of voltage level on the main word line 19 will gate ON the transistor 12 of all of the cells to which such line is connected. The response to a zero charge level on cell 28 will be a slight decrease in the voltage on the bit line 24, due to the connection to such line of the capacitor 14 of cell 28. This decrease is represented in FIG. 3 by the slight decrease in voltage represented at 33 in the voltage level represented by diagram line 34. Of course, when the capacitor 14 is placed into communication with the much larger capacitance of line 24 when transistor 12 is turned ON, a charge will be applied thereto as represented by a large voltage level rise 36 on lines 29 and 30. In this connection, the voltage levels represented by lines 29 and 30 will be the same, except as affected by the refreshing operation to be described later.

Sense amplifier and driver circuitry 27 will sense the voltage decrease on bit line 24 and respond thereto by driving to zero the voltage on the bit line and, hence, on capacitor 12 of cell 28. This is represented in FIG. 3 by the voltage decrease on line 34 indicated at 37. Thus, the charge in the capacitor voltage will be returned to zero relative to ground, indicating the original binary "0" stored therein.

If a binary "1" is to be written into cell 28, a pulse, represented at 38 on voltage level line 39 of FIG. 3, is applied to the "write 1" control circuitry, which circuitry responds thereto by directing the line driver to appropriately increase the voltage on bit line 24. That is, the voltage level on main bit line 24 is again returned to its high voltage state so that capacitor 12, still in communication with bit line 24, will be charged sufficiently to represent a binary "1". This is represented in FIG. 3 by the increase in the capacitor voltage indicated at 41 on voltage level lines 29 and 30. The voltage pulse 31 which was applied to main word line 24 to enable cell 28 to be addressed is then terminated, with the result that cell 28 now stores a binary "1" rather than a binary "0".

As is represented by the slope given to voltage level line 29 of FIG. 3, the charge on the capacitor will slowly leak and, hence, the voltage level on such capacitor will correspondingly decay. In the event that cell 28 is neither refreshed nor again accessed for an electronically significant period of time, such voltage will decrease to the point that when the cell is again accessed by the circuitry 27, the cell level will indicate that it is a binary "0" which is stored, rather than a binary "1". It is for this reason that periodic refreshing is required.

The operation of writing a binary "0" in cell 28 will now be described. Once again, the cell of interest (cell 28) is addressed by suitably raising the voltage on word line 19 to gate ON transistor 12. This increase in voltage is represented in FIG. 3 by pulse 42 on voltage level line 32. Capacitor 14 will then be connected to main bit line 24, with the result that the capacitor charge will be changed due to the voltage level of such line. In this connection, since the capacitor already has significant charge thereon in view of the earlier operation described, communication of the capacitor with the main bit line will not change the voltage level on the main bit line sufficiently to be sensed for operation of the line driver. However, because the amount of charge on the capacitor has diminished somewhat due to leakage, the capacitor will be recharged to its full high level merely by the fact that it has been placed in communication with the main bit line. This is represented by the slight increase in voltage indicated at 43 on voltage level line 29 of FIG. 3.

A pulse, represented at 44, is applied to the "write 0" control circuitry whenever it is desired that a binary "0" be written into a cell. The "write 0" circuitry will respond thereto by directing the driver in the main bit line circuitry 27 to force the voltage level on main bit line 24 to zero relative to ground. This is represented by the voltage decrease 46 in voltage level line 34. Thus, the charge on capacitor 12 will be drained, and cell 28 will then have a binary "0" stored therein. The drain of the charge in the capacitor is represented by the voltage level drop represented at 47 in voltage level lines 29 and 30.

It is important to note from the above that the operation of accessing a memory cell and reading the information therein automatically refreshes the same. That is, if the cell is accessed and a charge is read therefrom indicating a binary "0", the bit line driver responds thereto by forcing the voltage level on the bit line to zero, thereby draining any residual charge which might be on the capacitor. And if the capacitor has a sufficient charge on it to represent a binary "1", the voltage level on the bit line will remain high with the result that the capacitor is again brought to its full charge.

It will be recognized that the above operation of reading and writing information will be occurring simultaneously on all cells connected to a particular word line. Individual cells can be accessed by utilization of the appropriate word line and bit line.

To the extent thus far described, operation of the electronic memory of the invention is conventional; i.e., the individual cells are addressed, and the information stored therein is read and sometimes changed in a conventional fashion. As mentioned previously, the difficulty with a conventional dynamic memory made up of a plurality of single transistor cells is that the capacitive charge on the individual cells will slowly decay and, unless they are refreshed, result in erroneous readings. Because of this, data processing by a computer having an electronic dynamic memory typically is interrupted periodically to permit cycling through the cells for refreshing. This interruption and cycling is relatively expensive in computer operation time, programming complexity, and additional circuitry.

The electronic memory of the invention eliminates the need to interrupt computer operation for refreshing, although it retains the basic simplicity of a dynamic cell memory. That is, it will appear to a programmer to be a "static" memory, but does not require circuitry typically required by such a memory. Only one additional transistor per memory cell need be provided, and the additional control circuitry basically is merely a duplication of the simple word line and bit line circuitry already provided.

The additional transistor required by each cell is the previously mentioned transistor 13. As best seen in the enlarged view of FIG. 2, the gate of transistor 13 of cell 28 is controlled by the voltage on a refresh word line 51 emanating from conventional word line driver circuitry represented by block 52. The source of transistor 13 of cell 28 is connected to a refresh bit line 53 emanating, in turn, from bit line sense amplifier and driver circuitry represented at 54. Transistor 13 is thus connected within the circuitry to act, in effect, as a switch controlled by the voltage level on word line 51, between bit line 53 and capacitor 14.

As mentioned above in connection with the discussion of accessing the cell for the purpose of reading the information stored therein, the simple act of reading the information results in it being refreshed. Thus, to refresh the cells it is only necessary to periodically cycle through the same for reading. Except for the special case discussed below, the operation of refreshing can be completely independent of normal accessing of the memory for data processing. Thus, the rate of cycling for refreshing is selected to assure that each of the cells is periodically refreshed sufficiently often to prevent erroneous readings.

Voltage level line 56 in FIG. 3 represents the voltage level on the word line controlling operation of the transistor 13 of, for example, cell 28. The voltage pulses 57 on such line to gate the transistor ON are analogous to pulses 31 and 42 on the voltage level line 32 for the main word line. And the slight voltage decrease 58 indicated on voltage level line 59 for the refresh bit line is analogous to the voltage depression 33 on main bit line voltage level represented at 34. When this slight decrease is sensed by the sense amplifier in the refresh bit line circuitry 54, the voltage on the bit line is forced to zero as represented at 60 on voltage level line 59.

If sufficient charge is stored on the capacitor 14 to represent a binary "1", the full charge will be restored on such capacitor upon the next accessing pulse for refresh, which pulse is represented at 61 on voltage level line 56. The resulting slight increase in the voltage on the capacitor is represented at 62 on voltage level line 30. As mentioned previously, it is voltage level line 30, rather than voltage level 29, which represents the actual charge state on capacitor 14.

It will be noted that when cell 28 is refreshed by the circuitry of the invention when it is intended that the cell represent a binary "0" by having no charge capacitively stored therein, there is a short period of time, e.g., 10 nanoseconds, when the cell in fact has a significant charge thereon due to the refreshing operation. This phenomenon occurs before the refresh amplifier has had time to react after the capacitor is first communicated with the refresh bit line, and is represented on voltage level line 30 of FIG. 3 by spike 63. It will be readily appreciated that it is important that precautions be taken to prevent this momentary change in the voltage level of the cell from causing erroneous readings of the state intended to be represented by the capacitance of the cell. While there are various ways in which this possible erroneous operation could be prevented, it is a simple matter merely to delay any access to a cell for data processing while the cell is being refreshed. It should be noted that it will be quite unusual for the same cell to be accessed simultaneously for both data processing and refreshing and that spike 63 exists for only a very short time, which time typically is much less than the memory access time. Thus, the inclusion of such a delay will not materially affect the speed of operation of the electronic memory.

As discussed above, each individual cell is accessed by the application of pulses to its word lines. If it is being accessed for data processing, the pulses are applied to the appropriate main word line emanating from the main word line driver circuitry represented by block 22. In the event the cell is being accessed for refreshing, the pulses are applied to the appropriate refresh word line emanating from the refresh word line circuitry represented by block 52. The timing of the word line pulses is controlled, respectively, by a main word clock (circuitry 22) and a refresh word clock (circuitry 52). The logic diagram of FIG. 4 correlates the timing of operation of the two clocks to prevent erroneous operation. With reference thereto, the pulses emanating from the main clock are controlled by a flip-flop switch. That is, the actual main clock signal is passed through the logic in such a way that a delay is caused whenever a cell is being accessed simultaneously for both refresh and data processing. In this connection, the periodic pulse signal from the main clock is fed to one terminal of an AND gate 66, whereas the pulses from the refresh clock are first inverted by inverter 67 and then fed to the other input terminal of AND gate 66. Gate 66 is selected to have its output go high whenever a pulse (a high state) from the main clock is received at the very same time no pulse (a low state) from the refresh clock is applied to it through the inverter 67. That is, whenever a cell is not being accessed for data processing at the time it is being refreshed, the output of AND gate 66 will go high.

The output of AND gate 66 is fed to one input terminal of an OR gate 68. OR gate 68 will react to a high state at such input by supplying the appropriate state to its output terminal for operation of a flip-flop 69 to form main clock pulses. In this connection, flip-flop 69 provides either a high or low state and acts, in effect, as a pseudo-main clock. It will provide the high state on its output whenever it receives an appropriate high signal on its input terminal 70. Its other input terminal 71 is controlled by an inverted signal from the master clock. Flip-flop 69, therefore, will form a main clock pulse whenever it is directed to do so by the state of its input terminal 70. At all other times, its output will be controlled by the master clock to be low.

If the main clock attempts to access a particular memory cell at the very same time such cell is being accessed by the refresh clock, AND gate 66 will have a low state and thus OR gate 68 will not react thereto. The master clock and refresh clock states are, however, also fed to a second AND gate 72. As illustrated, the refresh clock state is fed through a delay 23 which delay is selected to provide a time delay at least as great as the time length of the capacitor voltage spikes which might result in erroneous operation.

AND gate 72 is selected to have a high state whenever there is correspondence between a main clock pulse and a delayed refresh clock pulse. This high state is fed to the other input terminal of OR gate 68 to control flip-flop 69 whenever such a delay is required. It will be recognized that this control provides, in effect, a delay in the main clock pulse.

Figure 4:
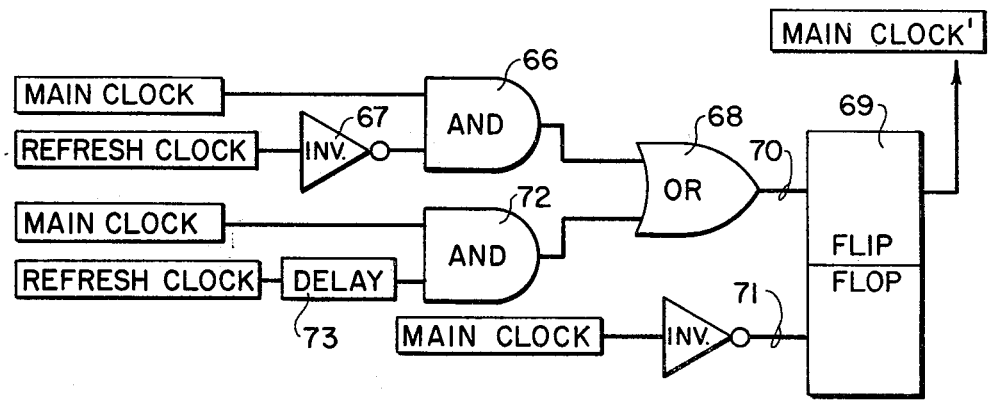
FIG. 4 is a logic diagram of circuitry which is included to prevent the refreshing operation from interfering with the normal sensing and application of voltage levels on the cells of the preferred embodiment of FIG. 1.

The manner in which the logic of FIG. 4 assures a cell cannot be accessed for data processing at the same time it is being refreshed, will be obvious from the above. It is important also that one not attempt to refresh at the same time a main bit line is being accessed. This can be prevented simply by comparing the addresses which are being, at any particular time, accessed on the main and refresh bit lines. If there is a match, the refresh operation is inhibited.

The best mode contemplated by the inventor for carrying out the invention has been described in detail in order to comply with the patent statutes. It will be recognized, however, that many changes can be made and that the inventive concept would be incorporated into other electronic memories. Thus, it is intended that the coverage afforded applicant be limited only by the claims and their equivalent language.

I claim:
1. A pseudostatic electronic memory comprising:
   A. an array of capacitative memory cells, each one of which is adapted to hold any one of a plurality of different amounts of electrical charge representative of information to be stored and includes;
      (1) a first electronic switch for controlling the application and sensing of charge on said cell;
      (2) a single second electronic switch for controlling periodic detection and refreshing of the charge on said cell;
   B. means both to apply electrical charge to said cells and to sense the amount of charge thereon at any given time;
   C. means independent of said charge application and sensing means to detect and refresh periodically the amount of charge on each of said cells;
   D. the operation of said first electronic switch being controlled by the voltage state present on a word line of said array, and the charge on said cell being sensed and applied thereto through a bit line of said array; and
   E. the operation of said second electronic switch being controlled by the voltage state present on a second word line of said array, and the charge on said cell being detected and refreshed periodically through a second bit line of said array.

2. A pseudostatic electronic memory according to claim 2 wherein in each of said cells there is only one first electronic switch for controlling the application and sensing of charge on said cell.

3. A pseudostatic electronic memory according to claim 1 wherein each of said switches is a field effect transistor.

4. A pseudostatic electronic memory according to claim 3 wherein each of said cells further includes a capacitor for storing said electrical charge representative of information to be stored.

5. A pseudostatic electronic memory according to claim 1 wherein means are included to prevent erroneous determinations of the information represented by said cell from being caused by the operation of refreshing said charge through said second switch.

* * * * *